US011063382B2

(12) United States Patent
Gorbutt et al.

(10) Patent No.: US 11,063,382 B2
(45) Date of Patent: Jul. 13, 2021

(54) WATERPROOF AND EXPLOSION-PROOF CIRCUIT BOARD AND ELECTRONIC VALVE ACTUATOR FOR FLOW CONTROL APPLICATIONS

(71) Applicant: Flowserve Management Company, Irving, TX (US)

(72) Inventors: Michael Gorbutt, Lynchburg, VA (US); William Hooss, Rustburg, VA (US); Dan Morris, Forest, VA (US)

(73) Assignee: Flowserve Management Company, Irving, TX (US)

( * ) Notice: Subject to any disclaimer, the term of this patent is extended or adjusted under 35 U.S.C. 154(b) by 255 days.

(21) Appl. No.: 15/985,754

(22) Filed: May 22, 2018

(65) Prior Publication Data

US 2019/0363475 A1    Nov. 28, 2019

(51) Int. Cl.
| | | |
|---|---|---|
| *H01R 13/436* | (2006.01) | |
| *H01R 13/52* | (2006.01) | |
| *H02G 15/013* | (2006.01) | |
| *H05K 1/02* | (2006.01) | |
| *F16L 5/08* | (2006.01) | |

(52) U.S. Cl.
CPC ............ *H01R 13/4362* (2013.01); *F16L 5/08* (2013.01); *H01R 13/5216* (2013.01); *H02G 15/013* (2013.01); *H05K 1/0298* (2013.01)

(58) Field of Classification Search
CPC ... H01R 13/4362; H01R 13/5216; F16L 5/08; H02G 15/013; H05K 1/0298; H05K 5/069
See application file for complete search history.

(56) References Cited

U.S. PATENT DOCUMENTS

| | | | | |
|---|---|---|---|---|
| 4,549,108 | A | 10/1985 | Hermens | |
| 5,727,110 | A | 3/1998 | Smith et al. | |
| 8,354,587 | B2* | 1/2013 | Tappel | H05K 5/069 174/50.5 |
| 9,541,428 | B2* | 1/2017 | Fink | H01R 4/023 |
| 9,554,483 | B2* | 1/2017 | Fink | H05K 7/1465 |
| 10,670,433 | B2* | 6/2020 | Fink | H05K 5/069 |

(Continued)

OTHER PUBLICATIONS

International Search Report and Written Opinion dated Oct. 11, 2019 in co-pending International Application No. PCT/US2018/033061.

*Primary Examiner* — Nathan Milakovich

(74) *Attorney, Agent, or Firm* — Dinsmore & Shohl, LLP

(57) ABSTRACT

A bulkhead passthrough connector containing a printed circuit board (PCB) for transferring electrical signals across a bulkhead to an electronic valve actuator, an electronic valve actuator configured to operate and communicate with a valve using a PCB through a bulkhead, the electronic valve actuator, and a method of assembling a bulkhead passthrough connector incorporating a PCB. The embodiments may include a passthrough partition which separates one side of the bulkhead from another. A PCB retainer may also be secured to the passthrough partition. The PCB is attached to the PCB retainer and extends from one side to another side of the bulkhead through the passthrough partition. The PCB further includes electrical paths printed on the PCB and electrical connectors located on both sides of the bulkhead to enable communication with external devices.

12 Claims, 7 Drawing Sheets

(56) References Cited

U.S. PATENT DOCUMENTS

| | | | |
|---|---|---|---|
| 2011/0317390 A1* | 12/2011 | Moser | G01F 15/14 |
| | | | 361/807 |
| 2015/0340133 A1 | 11/2015 | Jungbauer et al. | |
| 2016/0111814 A1 | 4/2016 | Hirano et al. | |
| 2019/0063964 A1* | 2/2019 | Wolff | G01D 11/245 |
| 2019/0082529 A1* | 3/2019 | Sloey | H05K 5/069 |

* cited by examiner

WATERPROOF AND EXPLOSION-PROOF CIRCUIT BOARD AND ELECTRONIC VALVE ACTUATOR FOR FLOW CONTROL APPLICATIONS

TECHNICAL FIELD

This present disclosure relates generally to electronic valve actuators and related flow control equipment, and more particularly to an electronic valve actuator with a printed circuit board (PCB) that is packaged with a valve actuator to provide one or both of improved waterproof or explosion-proof features.

BACKGROUND

Conventional electronic valve actuators comprise an electrically driven input shaft and interact or are monitored with various sensors and inputs. Since valve actuators may be part of a system in hazardous operating conditions, certain components of the valve actuator may be located in a bulkhead to protect them from damage.

Bulkheads may be used in any number of applications or industries where two electrical compartments are to be separated. For example, a bulkhead can separate a customer interface compartment from an internal compartment the latter of which the customer is not intended to enter. A bulkhead may also separate two distinct internal electrical compartments that have weatherproof, flameproof, or explosion-proof capability and where access should be restricted. Traditional bulkheads may utilize wired connections (called passthrough connectors) to allow data transfer and related communication between the two sides of the bulkhead. The bulkhead passthrough allows for monitoring, actuation, communication, and other needed functions for the bulkhead. The passthrough connectors also allow for interfacing with terminal blocks that may be integrated into the bulkhead.

However, due to the necessary size of the wires used in traditional passthrough connectors, there are a limited number of electrical paths available to transfer signals through the bulkhead. Additionally, the passthrough wires are present in a part of the path through the bulkhead that requires sealing to prevent deterioration of the system. These commonly used technologies require a high number of interconnects and therefore take up additional of space that can be reduced to improve the performance of the bulkhead. Further, the wires can cause negative electromagnetic compliance and compatibility issues.

Moreover, the use of traditional bulkhead passthrough connectors utilizing wires to transmit signals typically requires the use of poured seals for the bulkhead in order to separate the two bulkhead sides. The process of creating the poured seal is cumbersome, time consuming, and difficult. Specifically, the mixtures to form the seal must be poured into the space in the bulkhead with the wires in a specific order and time must be taken to allow the mixture to harden. Additionally, the mixture must be maintained at a specific temperature during this process to cure properly. This procedure is typically performed in the field with limited tools, resources, and time, making the task even more difficult.

Another type of bulkhead passthrough connector sends high frequency radio signals, such as WiFi (Wireless Fidelity) or Bluetooth, through the bulkhead to facilitate communication between the two sides of the bulkhead. However, the use of high frequency radio signals to transfer information greatly increases cost due to the expensive telecommunication parts required.

There remains a need to provide a bulkhead passthrough connector that reduces the space taken up in the bulkhead by the connector, removes the need for poured seals, and reduces the cost of the connector and the cost of the installation process.

SUMMARY

In one embodiment, a bulkhead passthrough connector for transferring electrical signals across a bulkhead to an electronic valve actuator is disclosed. The connector may include a passthrough partition which separates one side from another side of the bulkhead. A PCB retainer may also be secured to the passthrough partition. A PCB is attached to the PCB retainer and extends from one side to another side of the bulkhead through the passthrough partition. The PCB can be configured to transmit electric signals from the one side to another side of the bulkhead. The PCB further includes paths printed on a printed circuit board and electrical connectors located on both sides of the bulkhead to enable communication with external devices. The PCB may further be used with electronic valve actuators.

In one embodiment, an electronic valve actuator configured to operate and communicate with a valve through a bulkhead, the electronic valve actuator is disclosed. The electronic valve actuator includes a motor which actuates the valve by a motor drive shaft, and the motor is controlled by a gear key encoder programed through the electrical signals of the passthrough connectors. Bulkhead passthrough connectors may transfer electrical signals across each bulkhead to an electronic valve actuator. Controlling an electronic valve actuation using a PCB may be achieved if the PCB can interface with local control using knobs, touchscreen or rotary switches. The PCB can utilize remote control through wires connected to a remotely located control using knobs, touchscreen or rotary switches. The PCB can use wireless control. The PCB can use network control using wires or wireless input.

In one embodiment, a method of assembling a bulkhead passthrough connector for an electronic valve actuator is disclosed. A PCB is secured within a PCB retainer, where the retainer has an aperture to accept the PCB. The PCB is positioned in the aperture so the PCB extends through the PCB retainer and the PCB retainer is secured to a passthrough partition so the PCB extends through the passthrough partition. The assembled bulkhead passthrough connector is configured to be secured to a bulkhead so the passthrough partition separates one side of the bulkhead from the other to transmit signals. The bulkhead is then attached to the electronic valve actuator so one side cooperates with the electronic valve actuator, which allows the PCB to interface with a gear key encoder. The gear key encoder controls the electronic valve actuator motor and drives a motor drive shaft to actuate the valve.

BRIEF DESCRIPTION OF THE SEVERAL VIEWS OF THE DRAWINGS

The following detailed description of the present disclosure can be best understood when read in conjunction with the following drawings, where like structure is indicated with like reference numerals and in which.

DETAILED DESCRIPTION

Figure 1:
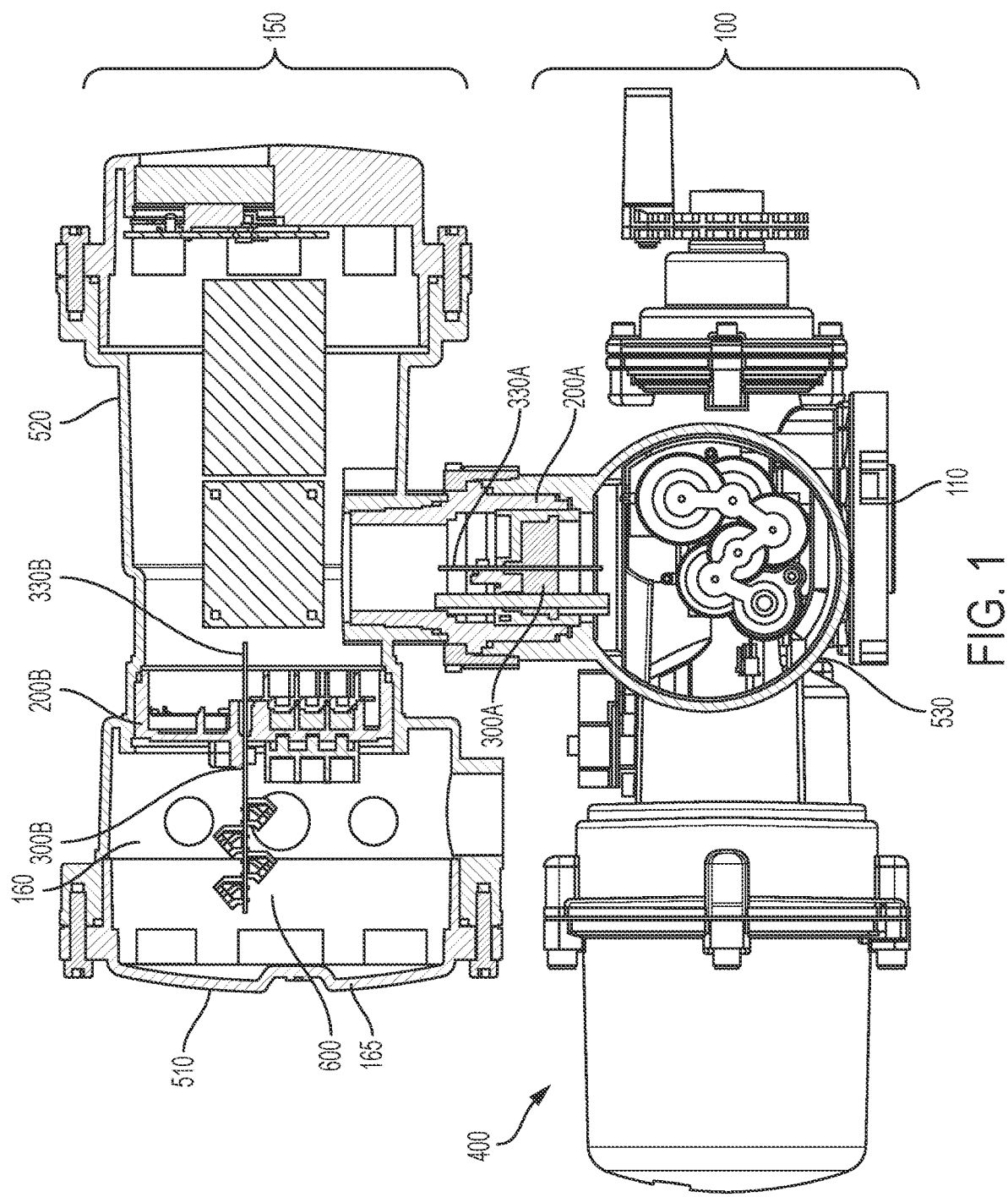
FIG. 1 shows a cutaway view of an electronic valve actuator attached to a valve actuator control through a bulkhead which is actuated by a PCB of a PCB bulkhead assembly and a PCB within the valve actuator control, according to one aspect of the present disclosure.

Referring initially to FIG. 1, a valve actuator control 150 coupled to an electronic valve actuator 100 through a first bulkhead 200A and a first PCB 330A. The valve actuator control 150 further comprises a second bulkhead 200B and a second PCB 330B located between a first compartment 510 and a second compartment 520 of the valve actuator control 150. The valve actuator 100 and the first bulkhead 200A are connected to a valve (not shown) through a valve interface 190. The actuator 100 includes circuitry formed on the first PCB 330A of the first bulkhead 200A which communicates between valve actuator control 150 and the valve actuator 100. The first PCB 330A of the valve actuator control 150 and the valve actuator 100 are shown located within a first PCB bulkhead assembly 300A, which is configured to secure the first PCB 330A within the first bulkhead 200A.

Figure 2:
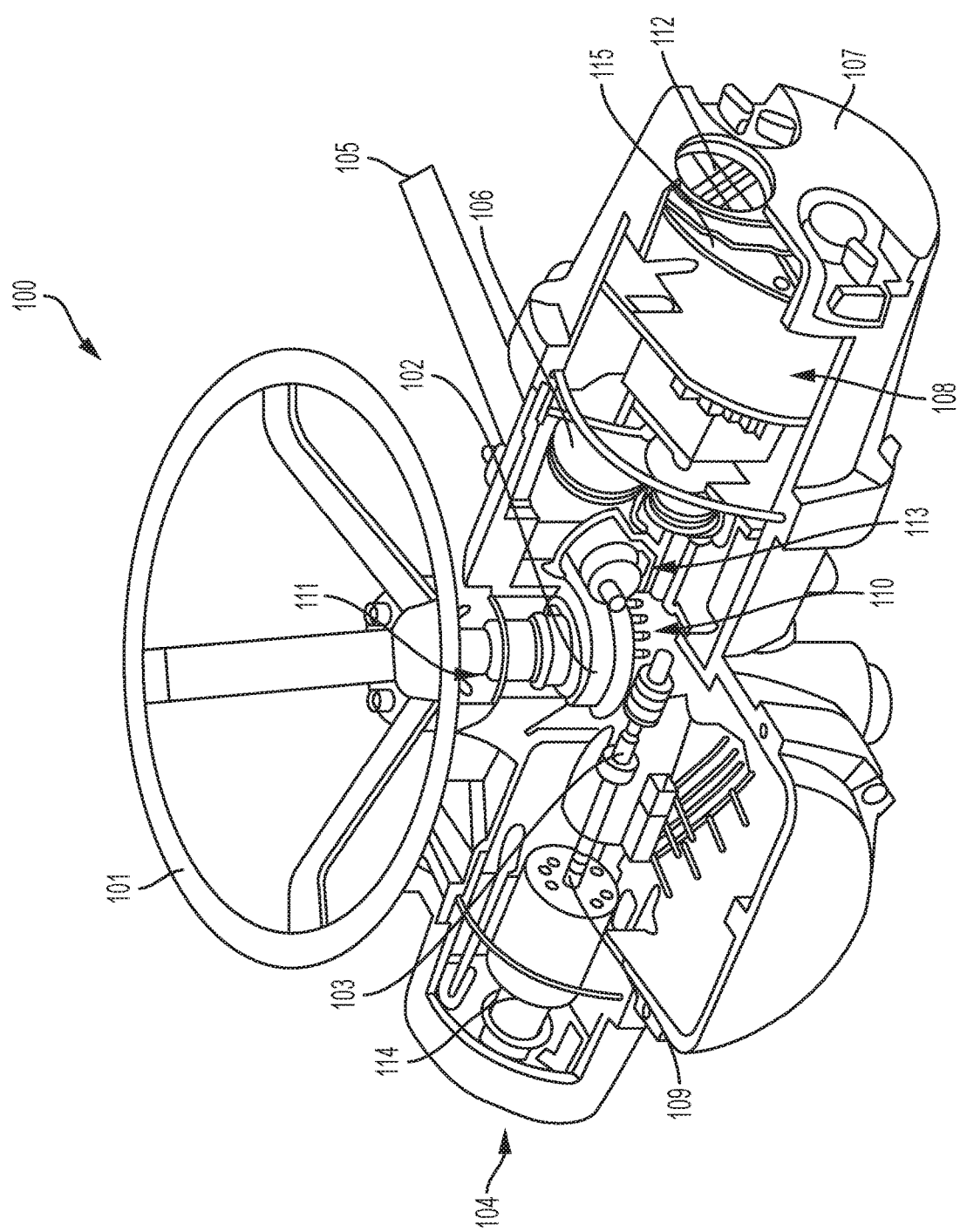
FIG. 2 shows a cut-away view of one example of a valve actuator that may be incorporated by the present disclosure.

FIG. 2 shows a valve actuator 100 which could be incorporated in at least one embodiment according to the present disclosure. An optional hand wheel 101 attached to a drive sleeve 102 though a hand wheel adapter 111 may be used to manually control the electronic valve actuator. The housing 104 encapsulates the motor 114 which drives a motor drive shaft 109 and an optional worm shaft 103 to engage the worm gear 110 of the drive sleeve 102 or other supplemental actuation means. The motor drive shaft 109 then actuates the valve. A declutch handle 105 and a declutch mechanism 113 may also be included to engage and disengage the drive sleeve 102 or other supplemental actuation means. A gear key encoder 106 allows the electronic valve actuator 100 to achieve repeatable control of the actuation by sensing the valve position. The gear key encoder 106 may be included in a controller (not shown) which provides a means of controlling all or part of the electronic valve actuator 100. The gear key encoder 106 may be programmed by one or more logic elements, such as processors capable of executing machine readable instructions contained within PCBs 330. The disclosed electronic valve actuator 100 of FIG. 2 also comprises a control module 108, circuit board 115, control panel 107 and display 112, or may replace one or more of these elements with a PCB 330 or PCB bulkhead assembly 300. The electronic valve actuator 100 is therefore capable of actuating a valve by receiving inputs from a PCB 330 to activate the motor 114 as required to actuate the valve through the motor drive shaft 109 according to the gear key encoder 106.

Referring again to FIG. 1, the use of the first PCB 330A in this embodiment allows for separation of the valve actuator 100 and the valve actuator control 150 to prevent unwanted crossover interference of electronic signals through multiple wires, a waterproof seal, and an explosion-proof barrier. In one form shown in FIG. 1, the second bulkhead 200B is positioned between the first compartment 510 and the second compartment 520 of the valve actuator control 150, where a customer has access to the first compartment 510 but where the second compartment 520 is inaccessible. A portion of the valve actuator 100 or the valve actuator control 150 that is inaccessible may restrict direct or indirect physical access or may restrict direct or indirect electrical or communication access. The first compartment 510 may comprise terminal blocks 600 to allow the customer to interface with the second PCB 330B which will then communicate with the system of the second compartment 520. The first compartment 510 may comprise a user interface 160 allowing access to the valve actuator control 150 to the customer, which may simplify the interaction with the first PCB 330A and the valve actuator 100, protected by a user access cover 165. In another form, shown in FIG. 1, the first bulkhead 200A is positioned between the second compartment 520 of the valve actuator control 150 and a third compartment 530 of the valve actuator 100. In this embodiment the customer has access to neither compartment and the first PCB 330A communicates between the valve actuator 100 and the valve actuator control 150. These embodiments are contemplated to allow for the use of waterproof or explosion-proof seals.

Figure 3:
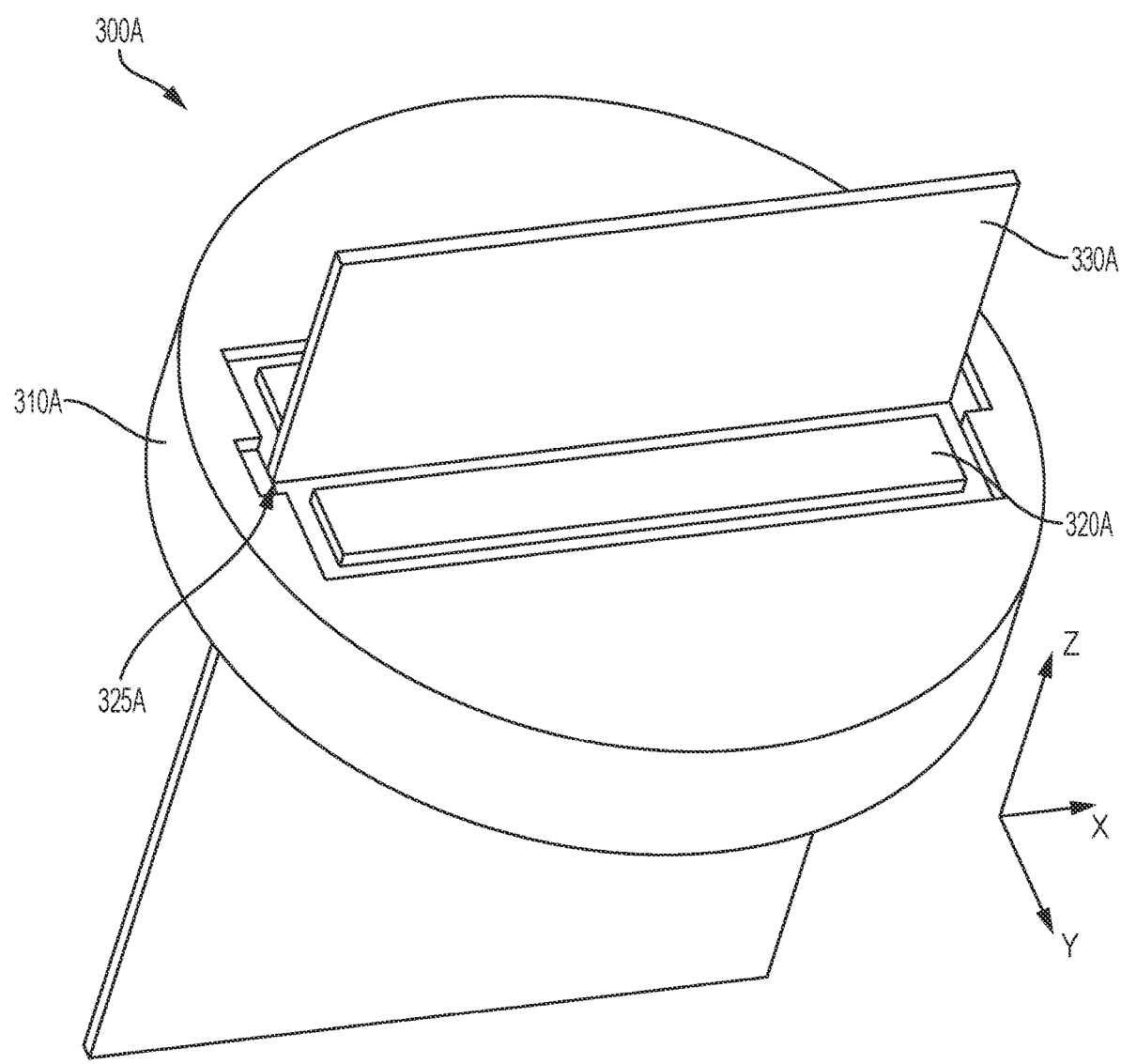
FIG. 3 shows a top perspective view of the PCB bulkhead assembly according to one aspect of the present disclosure.
Figure 4:
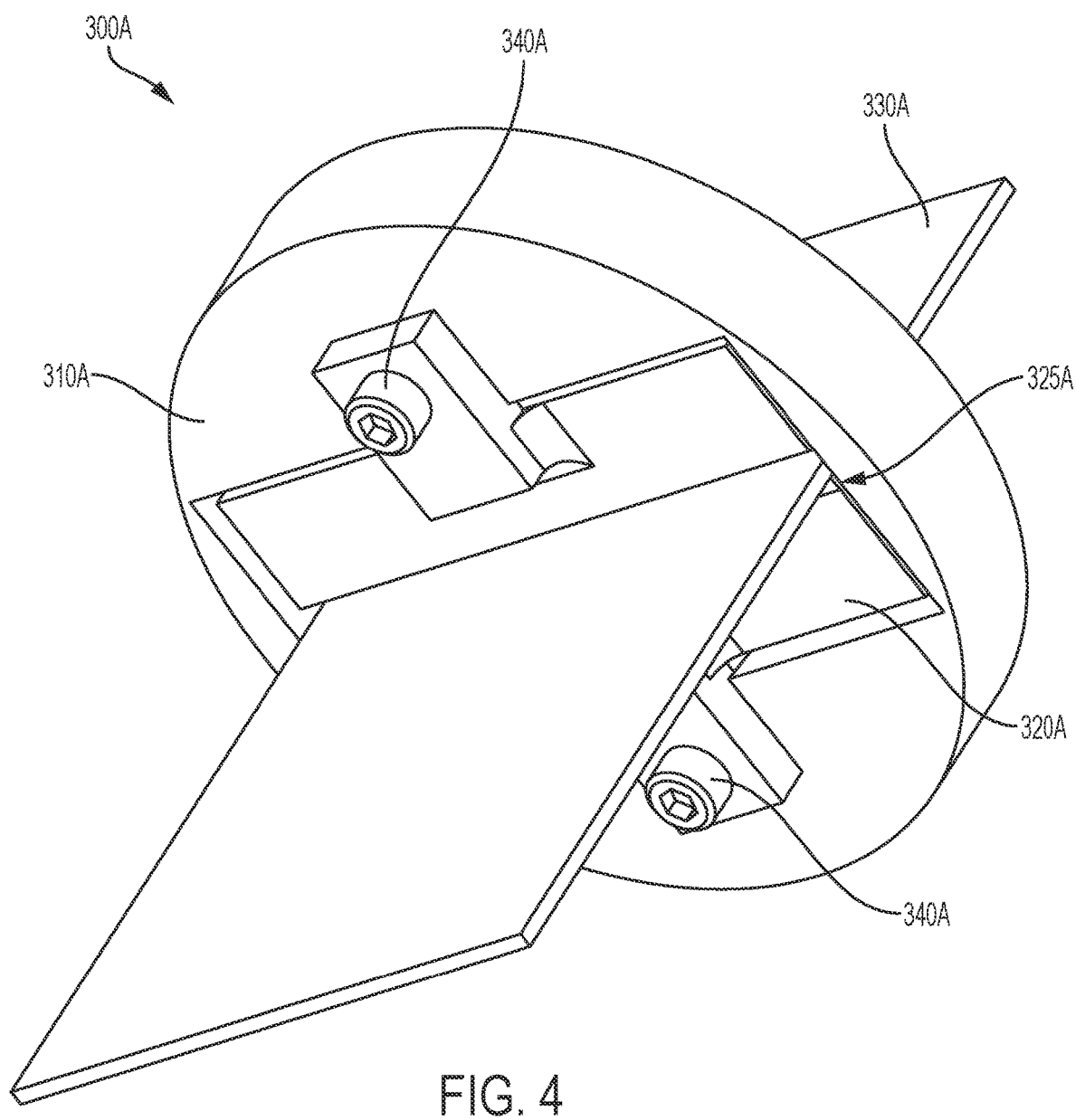
FIG. 4 shows a bottom perspective view of the PCB bulkhead assembly of FIG. 3, according to one aspect of the present disclosure.

Referring next to FIGS. 3 and 4, the first PCB bulkhead assembly 300A according to a first aspect of the present disclosure includes a bulkhead passthrough connector in the form of a passthrough partition 310A, PCB retainer 320A, and first PCB 330A. In one configuration, the passthrough partition 310A is designed to be fitted securely within the space separating the two sides of a bulkhead (not shown). Additionally, the passthrough partition 310A is contemplated to engage and secure the PCB retainer 320A. The PCB retainer 320A, secured to the passthrough partition 310A, maintains an aperture 325A defined within the PCB retainer 320A to cooperate and retain the first PCB 330A. The PCB retainer 320A may include two or more separate sections to allow for ease of installation and securing to the passthrough partition 310A. The use of more than one section for the PCB retainer 320A allows for simplified installation in the passthrough partition 310A as well as a simplified connection between the PCB retainer 320A and the PCB 330A. Finally, the first PCB 330A is coupled to the PCB retainer 320A as it extends from one side of the bulkhead to the other, allowing for communication of the signals sent through the first PCB 330A between the separate sides of the first bulkhead 200A.

In certain embodiments, the bulkhead 200A 200B can separate a user interface compartment from an internal compartment the customer is not intended to enter. The bulkhead 200A 200B may also separate two distinct internal electrical compartments that have weatherproof, flameproof, or explosion-proof capability and where access should be restricted. Bulkhead 200A 200B encompass passthrough connectors which facilitate data transfer between their two sides. The bulkhead passthrough allows for monitoring, actuation, communication, and other needed functions for the bulkhead 200A 200B. The passthrough connectors also allow for interfacing with terminal blocks 600 that may be integrated into the bulkhead 200A 200B.

Regarding the PCB 330A, 330B the removal of wires to transmit signals allows for creating a customizable combination of one or more power, analog, digital, and radio frequency (RF) signals to pass through a common bulkhead design. The PCB 330A, 330B is contemplated to include electrical paths as a set of internal solder traces, in place of the traditional wired bulkhead passthrough connectors. The use of the PCB 330A, 330B allows for a more compact and efficient design with a larger number of electrical paths than previously possible. The PCB 330A, 330B may be designed as a multi-layer design with multiple signal traces. Some of the connections possible with the PCB 330A, 330B include power, control, power lead, power for an alternating current (AC) and direct current (DC) actuator, analog connections to disclose the position of one or more valves, input and output, antenna connections, or the like. In at least one embodiment, a vertical orientation of the PCB 330A, along axis z of FIG. 3, minimizes bulkhead area to allow a maximum number of electrical signals and power to pass through an explosion-proof and waterproof barrier while minimizing the bulkhead surface area of the assembly. These configurations allow the passthrough to be used in high pressure containment applications in order to reduce the likelihood of leakage. Additionally, while an explosion-proof or waterproof seal may be used, applications requiring a weather-proof seal may also be used as a platform for the PCB bulkhead assembly 300A 300B and the respective PCB 330A, 330B.

In another embodiment, applying industry standard PCB layout techniques, such as RF strip-line and microstrip, to the PCB 330A 330B allow for an increased number of circuits on the PCB 330A 330B and remove the need for bulkier communication means. The present embodiments using the PCB 330A 330B allow for an air tight seal where traditional stranded wires bundled within an insulator in a wired design have a leak path present.

Additionally, the PCB 330A 330B may be designed with traditional circuit-aided design (CAD) techniques to also include PCB mounted connectors and electronic circuitry on both sides of the sealed bulkhead. The use of these techniques eliminates the need for wire cable harnesses to and from traditional bulkhead passthrough connectors. The use of a PCB 330A 330B built with this technology allows for compact designs, reduces cost, and prevents unwanted radiated electromagnetic interference. The PCB 330A 330B may also include custom circuit layouts which can be configured to provide communication needs required by any specific bulkhead design.

The PCB bulkhead assembly 300A, 300B allows for board-to-board connections on its service side, which would not be possible using the traditional wired bulkhead passthrough connectors. It is contemplated that one or more embodiments of the PCB bulkhead assembly 300A, 300B may include board-to-board connections on the PCB 330A 330B. Likewise on the customer side of the PCB bulkhead assembly 300A, 300B, the terminal blocks 600 (FIG. 1) for interface may be soldered to the PCB 330A 330B. The terminal block 600 allows for the interface between third-part equipment and the PCB 330A 330B using standardized connections. Further, the use of the PCB bulkhead assembly 300A, 300B allows for the use of weatherproof conduit seals and eliminates the need to seal the conduits with an explosion-proof or flameproof seal, although they may still be used in conjunction with the PCB bulkhead assembly 300A, 300B.

Figure 5:
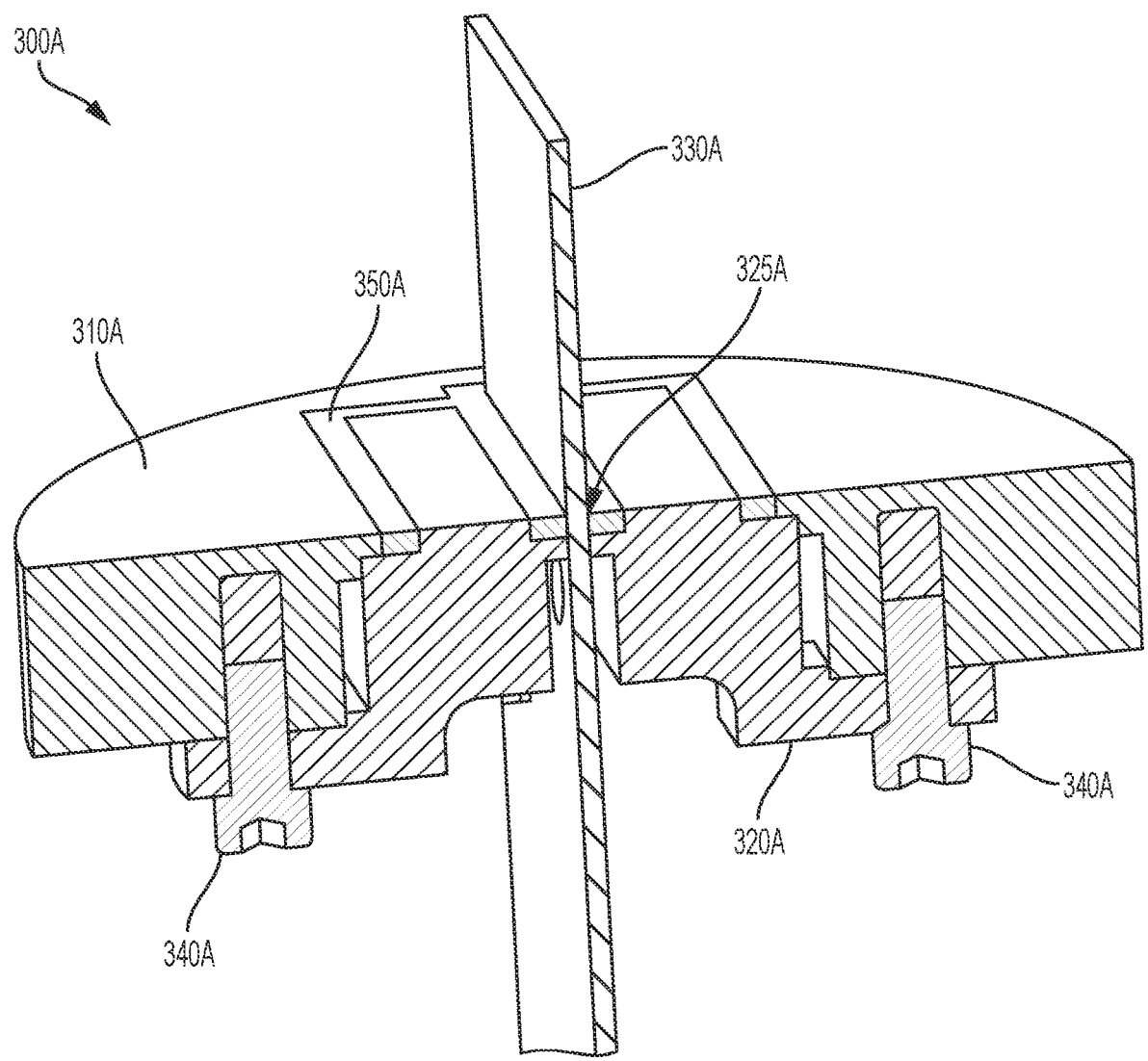
FIG. 5 shows a cutaway view of the PCB bulkhead assembly of FIGS. 3 and 5, along with a weather-proofing seal, according to one aspect of the present disclosure.
Figure 6:
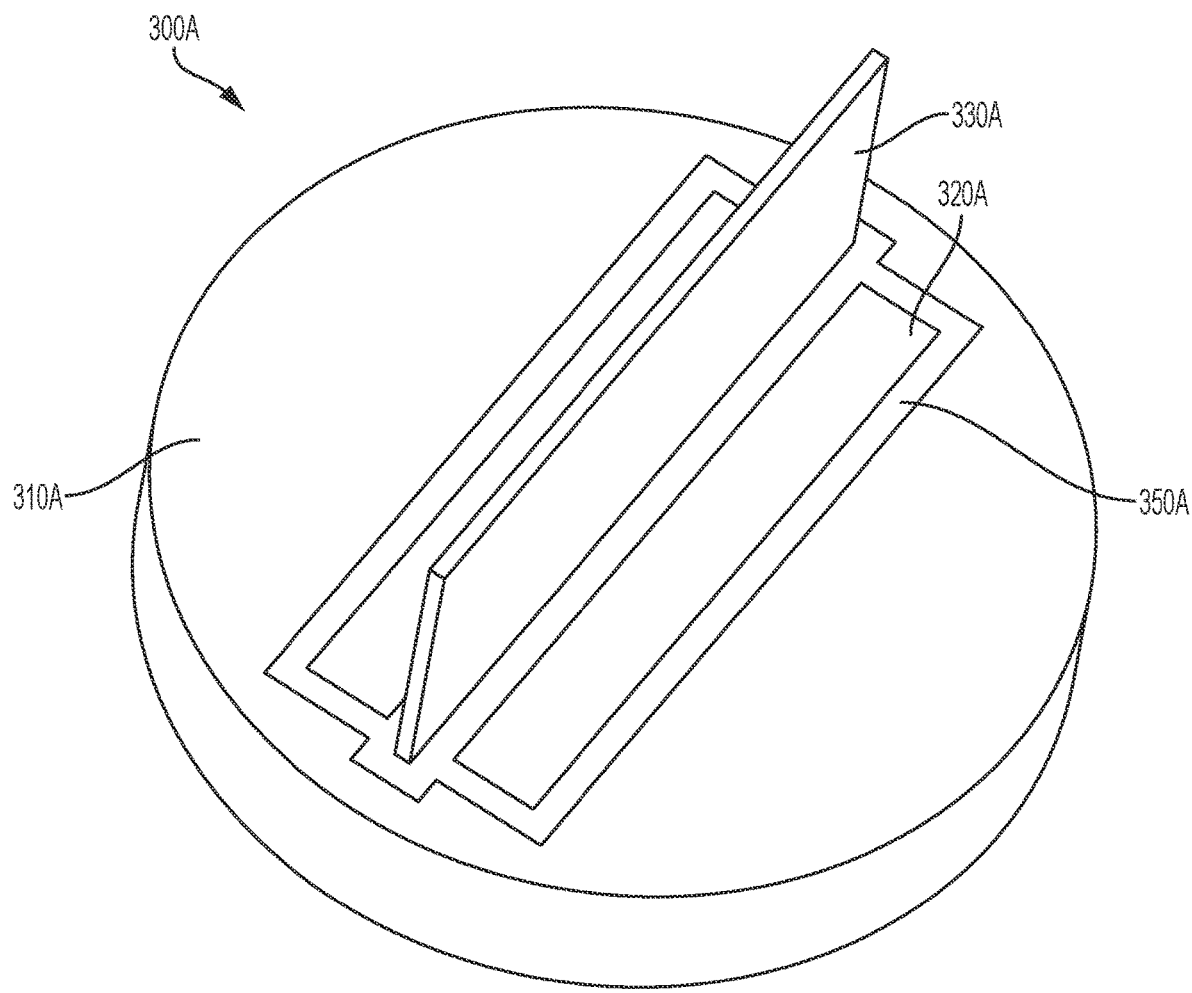
FIG. 6 shows a top elevation view of the PCB bulkhead assembly of FIG. 5, according to one aspect of the present disclosure.
Figure 7:
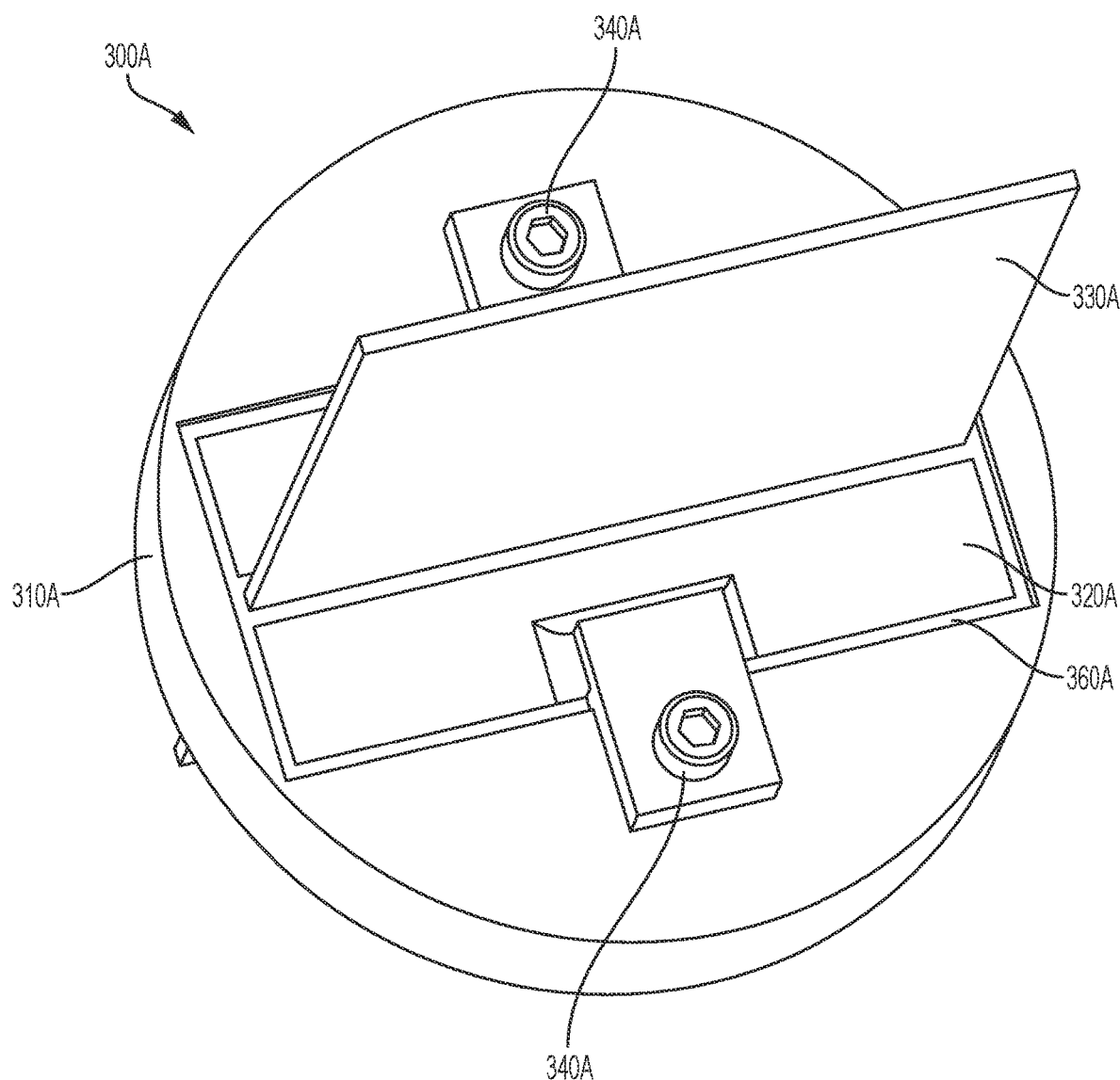
FIG. 7 shows a bottom perspective view of the PCB bulkhead assembly of FIG. 5 and FIG. 6 with an explosion-proof seal that may also include a weatherproof feature, according to one aspect of the present disclosure.

Referring finally to FIGS. 5 through 7, the first PCB bulkhead assembly 300A may include seals to ensure the continued performance of the bulkhead and allow the two sides of the bulkhead to remain isolated from each other during operation. Specifically, the first PCB bulkhead assembly 300A further includes a sealant 350A between at least the PCB retainer 320A, the passthrough partition 310A, and the PCB 330A, which may be designed to form a weatherproof seal. As shown in FIG. 7, the first PCB bulkhead assembly 300A may further include an epoxy 360A, which may be designed to form an explosion-proof seal. The first PCB bulkhead assembly 300A may also include fasteners 340A which secure the PCB retainer 320A to the passthrough partition 310A. The fasteners 340A may be any suitable means for securing, such as bolts, screws, pins, and clamps or any other suitable means, and further may be released to allow the PCB retainer 320A to be removed from the passthrough partition 310A. It may be desirable to remove the PCB retainer 320A so the PCB 330A can be serviced or removed from the first PCB bulkhead assembly 300A.

In at least one embodiment, the first PCB bulkhead assembly 300A communicates with the electronic valve actuator 100. Other types of equipment that can be controlled with the PCB 330A, 330B include pumps and valve positioners. The PCB 330A, 330B may interface with local control using knobs, touchscreen or rotary switches. The PCB 330A 330B may utilize remote control through wires connected to a remotely located control using knobs, touchscreen or rotary switches. The PCBs 330A, 330B may be controlled by wireless control. Finally, in another embodiment the PCBs 330A, 330B may utilize network control using wired or wireless inputs.

The PCB bulkhead assembly 300A 300B may be assembled and ready for use with significantly less effort than a traditional bulkhead assembly. One method of assembly the first PCB bulkhead assembly 300A as described herein is to first secure the first PCB 330A within one or more sections of the PCB retainer 320A. The PCB retainer 320A may include [an] the aperture 325A which is shaped to accept the first PCB 330A, and is defined within the PCB retainer 320A. The first PCB 330A extends through the PCB retainer 320A in order to allow communication between the two sides of the bulkhead. The PCB retainer 320A is secured to the passthrough partition 310A. The PCB retainer 320A can be secured to the passthrough partition 310A with the use of fasteners 340A or any other suitable means. Furthermore, the fasteners 340A may be releasable in order to allow the PCB retainer 320A to be separated from the passthrough partition 310A. The passthrough partition 310A is then placed within the bulkhead where the passthrough partition 310A separates the two sides of the bulkhead and the first PCB 330A allows electrical signals to pass from one side of the bulkhead to the other, and secured to the bulkhead. Additionally, a sealant 350A may be applied to the first PCB bulkhead assembly 300A to form a weather-proof seal while an epoxy 360A may be applied to the first PCB bulkhead assembly 300A to form an explosion-proof seal.

It is noted that terms like "preferably", "generally" and "typically" are not utilized herein to limit the scope of the claimed embodiments or to imply that certain features are critical, essential, or even important to the structure or function of the claimed embodiments. Rather, these terms are merely intended to highlight alternative or additional features that may or may not be utilized in a particular embodiment of the present disclosure. Likewise, for the purposes of describing and defining the present disclosure, it is noted that the terms "substantially" and "approximately" and their variants are utilized herein to represent the inherent degree of uncertainty that may be attributed to any quantitative comparison, value, measurement or other representation, as well as to represent the degree by which a quantitative representation may vary without resulting in a change in the basic function of the subject matter at issue.

While certain representative embodiments and details have been shown for purposes of illustrating the disclosure, it will be apparent to those skilled in the art that various changes may be made without departing from the scope of the disclosure, which is defined in the appended claims.

What is claimed is:

1. A printed circuit board bulkhead assembly comprising:
   a passthrough connector for transferring electrical signals across a bulkhead to an electronic valve actuator, the passthrough connector comprising:
      a passthrough partition separating a first side of the bulkhead and a second side of the bulkhead; and
      a printed circuit board retainer secured to the passthrough partition;
   a printed circuit board secured to the printed circuit board retainer and extending from the first side of the bulkhead to the second side of the bulkhead through the passthrough partition, the printed circuit board being configured to transmit electric signals from between the first side of the bulkhead and the second side of the bulkhead, the printed circuit board comprises electrical paths printed thereon and electrical connectors located at the first side of the bulkhead and the second side of the bulkhead configured to enable communication with external devices;
   at least one fastener to releasably secure the printed circuit board retainer to the passthrough partition; and
   a plurality of seals comprising:
      a weather-proof conduit seal between the printed circuit board retainer and at least one of the printed circuit board or the passthrough partition; and
      an explosion-proof seal between the printed circuit board retainer and at least one of the printed circuit board or the passthrough partition.

2. The bulkhead passthrough connector of claim 1, wherein the printed circuit board retainer maintains an aperture to cooperate and retain the printed circuit board.

3. The bulkhead passthrough connector of claim 1, wherein the printed circuit board retainer is comprised of a one or more separate sections joined together to secure the printed circuit board.

4. The bulkhead passthrough connector of claim 1, wherein the printed circuit board is a multi-layer circuit with multiple signal traces.

5. The bulkhead passthrough connector of claim 1, wherein the electrical connectors of the printed circuit board includes at least one of power, control, power lead, power for an ac actuator, power for a dc actuator, analog connections to disclose valve position, input and output, and antenna connections.

6. The bulkhead passthrough connector of claim 1, wherein the printed circuit board further comprises traces with RF strip-line and micro-strip printed circuit board layout.

7. The bulkhead passthrough connector of claim 1, wherein the printed circuit board further comprises printed circuit board mounted connectors on at least one side of the bulkhead.

8. The bulkhead passthrough connector of claim 1, wherein the printed circuit board further comprises board-to-board connections on at least one side of the bulkhead.

9. The bulkhead passthrough connector of claim 1, wherein the printed circuit board further comprises terminal blocks directly connected to the printed circuit board on at least one side of the bulkhead.

10. The bulkhead passthrough connector of claim 1, wherein the printed circuit board transmits signals to one or more actuators, pumps and/or valve positioners.

11. The bulkhead passthrough connector of claim 10, wherein the bulkhead is positioned between a valve and a valve actuator and the printed circuit board communicates between the valve and the valve actuator.

12. The bulkhead passthrough connector of claim 1, wherein the printed circuit board is controlled by local control, wired remote controls, wireless controls, wired network inputs, and/or wireless network inputs.

* * * * *